(12) United States Patent  
Okawa (10) Patent No.: US 7,535,246 B2  
(45) Date of Patent: May 19, 2009

(54) COMPUTING THE CHARACTERISTICS OF A FIELD-EFFECT-TRANSISTOR (FET)

(75) Inventor: Yasushi Okawa, Tokyo (JP)

(73) Assignee: Agilent Technologies, Inc., Santa Clara, CA (US)

( * ) Notice: Subject to any disclaimer, the term of this patent is extended or adjusted under 35 U.S.C. 154(b) by 109 days.

(21) Appl. No.: 11/647,116

(22) Filed: Dec. 28, 2006

(65) Prior Publication Data

US 2007/0182439 A1     Aug. 9, 2007

Related U.S. Application Data

(63) Continuation-in-part of application No. 11/452,664, filed on Jun. 14, 2006, now Pat. No. 7,429,869.

(30) Foreign Application Priority Data

Jun. 16, 2005     (JP)     ............................. 2005-176917

(51) Int. Cl.  
*G01R 31/26* (2006.01)

(52) U.S. Cl. ....................... 324/769; 324/713

(58) Field of Classification Search ................ None  
See application file for complete search history.

(56) References Cited

U.S. PATENT DOCUMENTS

| 3,789,301 | A | * | 1/1974 | Malaviya | ................... | 324/765 |
|---|---|---|---|---|---|---|
| 5,304,794 | A | * | 4/1994 | Malone et al. | .......... | 250/214 R |
| 5,524,281 | A | * | 6/1996 | Bradley et al. | ........... | 455/67.15 |
| 6,396,298 | B1 | * | 5/2002 | Young et al. | ................ | 324/769 |
| 6,407,573 | B1 | | 6/2002 | Yamaguchi et al. | | |
| 2007/0182439 | A1 | * | 8/2007 | Okawa | ....................... | 324/769 |

OTHER PUBLICATIONS

"Measurement of I-V Curves of Silicon-on-Insulator (SOI) MOSFET's Without Self-Heating". IEEE Electron Device Letters, vol. 16, No. 4, Apr. 1995.

* cited by examiner

*Primary Examiner*—Vinh P Nguyen  
(74) *Attorney, Agent, or Firm*—Marc Bobys

(57) ABSTRACT

A coefficient indicating the relationship between a measurement voltage of voltage measuring unit and a voltage drop in a drain bias voltage due to drain current is determined based on at least an S parameter of a measuring system and an input impedance of the measuring unit. A voltage drop at the drain is determined from the coefficient. Based on the determined voltage drop, a drain bias voltage actually applied to the drain of an FET is determined. Also, a coefficient for converting the measurement voltage of the measuring unit into a drain current is determined based on at least an S parameter of a measuring system and the input impedance of the voltage measuring unit and an electrical length of the measuring system if necessary. Based on the determined coefficient, a drain current actually flowing in the FET is determined.

7 Claims, 2 Drawing Sheets

COMPUTING THE CHARACTERISTICS OF A FIELD-EFFECT-TRANSISTOR (FET)

RELATED APPLICATIONS

This application is a Continuation-in-Part of U.S. patent application Ser. No. 11/452,664, filed on Jun. 14, 2006, now U.S. Pat. No. 7,429,869, which is incorporated herein by its entirety.

BACKGROUND

1. Field

The present disclosure relates to an FET (field effect transistor) characteristic measurement method in which a pulse voltage output from a pulse generator is applied to the gate of an FET in order to measure drain current flowing through the FET. More specifically, the present disclosure relates to a method for accurately measuring a voltage applied to the drain of the FET and the drain current.

2. Description of the Related Art

Conventionally, the IV (current-voltage) characteristics of an FET are determined by applying a predetermined DC voltage to the gate of the FET while a predetermined bias voltage is applied to the drain of the FET.

However, the known approach in which the DC voltage is applied to the gate has the following problems.

When the known measurement approach is used for measuring the IV characteristics of SOI (silicon on insulator) MOSFETs, strained-silicon MOSFETs, or the like, reliable measurement results of the IV characteristics may not be obtained due to a self-heating phenomenon of the FETs.

When the known measurement approach is used for measuring the IV characteristics of MOSFETs using high-k (high dielectric constant) gate insulators, reliable measurement results of the IV characteristics may not be obtained since electrons are trapped in defects in the insulator films, thus reducing the drain current driving force.

Accordingly, it has been proposed to apply a measuring method in which a short-duration pulse is applied to the gate of the FET (e.g., refer to K. A. Jenkins and J. Y-C. Sun, IEEE Electron Device Letters, Vol. 16, No. 4, April 1995, pp. 145 to 147). With such a measuring method, measurement results that are not affected by the self-heating can be obtained for MOSFETs employing SOI and strained silicon. Furthermore, with respect to MOSFETs using high-k gate insulators, IV characteristics that are close to these under actual operational conditions can be obtained (since microprocessors using the MOSFETs have internal circuits driven by pulses, not DC), without being affected by, for example, a reduction in a drain-current driving force caused by electron trapping in insulator defects.

When the measurement method using short-duration pulses is employed, a so-called bias tee is used. An DC (direct current) input of the bias tee is connected to a DC voltage source, a bias output of the bias tee is connected to the drain of an FET, and an AC output of the bias tee is connected to an input of a measuring apparatus, such as an oscilloscope. When the short-duration pulse is input to the gate of the FET, drain current generated in a pulsed manner is input to the measuring apparatus via the AC output of the bias tee and the current is then converted by the input impedance of the measuring apparatus into a voltage.

From a high-frequency point of view, the input impedance of the measuring apparatus acts as a shunt resistor interposed between the drain of the FET and the DC voltage source. Thus, when the drain current is generated, the drain bias voltage of the FET decreases because of a voltage drop caused by the input impedance. In a measuring system including the bias tee, the FET, and the measuring apparatus, a drop in the drain bias voltage can also occur because of impedance due to other elements, such as cables.

However, in the known measuring method, the value of the drain bias voltage corresponding to a measured drain current is regarded as the value of a voltage output from the DC voltage source during the measurement of the drain current (i.e., is regarded as the value of the bias output voltage of the bias tee), that is, a voltage drop caused by the input impedance of the measuring apparatus and so on is not taken into account. Therefore, the measured drain current is not based on an actual bias voltage of the drain terminal, thus causing a problem in that accurate measurement results of IV characteristics cannot be obtained.

In addition, in the known measuring method, the drain current may not be accurately detected because of current leaking from the bias tee and so on, thus making it difficult to obtain accurate measurements results of IV characteristics.

SUMMARY

Accordingly, an object of the present disclosure is to provide an FET-characteristic measuring method that is capable of more accurately measuring the IV characteristics of SOI (silicon on insulator) MOSFETs, strained-silicon MOSFETs, MOSFETs employing high-k (high dielectric constant) gate insulators, or the like.

The present disclosure provides an FET-characteristic measuring method in which a bias voltage output from a bias output terminal of a bias tee is applied to a drain of an FET and a pulse output from a pulse generator is applied to a gate of the FET to generate drain current in the FET; the generated drain current is converted by an input impedance of voltage measuring unit, connected to an AC output terminal of the bias tee, into a corresponding voltage; and the converted voltage is measured by the voltage measuring unit. The measuring method includes: a step of determining a coefficient indicating a relationship between a measurement voltage of the voltage measuring unit and a voltage drop in the bias voltage due to the drain current, based on at least an S parameter of a measuring system and the input impedance of the voltage measuring unit; the step of determining the voltage drop corresponding to the measurement voltage of the voltage measuring unit, based on the coefficient; and determining a value of a bias voltage actually applied to the drain of the FET, based on the determined voltage drop.

The coefficient determining step can include: a step of determining Y parameters corresponding to each order of a Fourier series for the pulse output from the pulse generator, based on the S parameters for multiple frequencies and the input impedance of the voltage measuring unit; and a step of determining the coefficient, based on the Y parameters and the Fourier series.

The coefficient can be determined, based on at least the S parameter of the measuring system and the input impedance of the voltage measuring unit and an electrical length of the measuring system.

The coefficient determining step can include: a step of determining Y parameters corresponding to each order of a Fourier series for the pulse output from the pulse generator, based on the S parameters for multiple frequencies and the input impedance of the voltage measuring unit; and a step of determining the coefficient, based on the Y parameters and the Fourier series and the electrical length.

The coefficient can be determined for each of multiple pulses having different pulse widths from each other, the multiple pulses being output from the pulse generator. In this case, relationships between the pulse widths of the multiple pulses and the coefficients corresponding to the pulse widths are stored in a table in storage.

When a pulse having a pulse width different from the pulse widths of the multiple pulses is output from the pulse generator, the coefficient corresponding to the pulse output from the pulse generator can be obtained by interpolating the contents of the table.

Preferably, the voltage measuring unit is a digital oscilloscope.

The S parameter of the measuring system can be an S parameter of the bias tee.

The measuring system can be the measuring system between the field-effect transistor and the voltage measuring unit wherein the measuring system including the bias tee.

In order to achieve the foregoing object, the present disclosure further provides an FET-characteristic measuring method in which a bias voltage output from a bias output terminal of a bias tee is applied to a drain of an FET and a pulse output from a pulse generator is applied to a gate of the FET to generate drain current in the FET; the generated drain current is converted by an input impedance of voltage measuring unit, connected to an AC output terminal of the bias tee, into a corresponding voltage; and the converted voltage is measured by the voltage measuring unit. The measuring method includes: a step of determining a coefficient for converting a measurement voltage of the voltage measuring unit into the drain current, based on at least an S parameter of a measuring system and the input impedance of the voltage measuring unit; and a step of determining a drain current actually flowing in the FET, based on the measurement voltage of the voltage measuring unit and the coefficient.

The coefficient determining step can include a step of determining a Z parameter corresponding to a Fourier coefficient of each order for the pulse output from the pulse generator, based on the S parameters for multiple frequencies and the input impedance of the voltage measuring unit; and a step of determining the coefficient, based on the Z parameter and a Fourier series.

The coefficient can be determined, based on at least the S parameter of the measuring system and the input impedance of the voltage measuring unit and an electrical length of the measuring system.

The coefficient determining step can include: a step of determining Z parameter corresponding to a Fourier coefficient of each order for the pulse output from the pulse generator, based on the S parameters for multiple frequencies and the input impedance of the voltage measuring unit; and a step of determining the coefficient, based on the Z parameter and a Fourier series and the electrical length.

The coefficient can be determined for each of multiple pulses having different pulse widths from each other, the multiple pulses being output from the pulse generator. In this case, relationships between the pulse widths of the multiple pulses and the coefficients corresponding to the pulse widths are stored in a table in storage.

When a pulse having a pulse width different from the pulse widths of the multiple pulses is output from the pulse generator, the coefficient corresponding to the pulse output from the pulse generator can be obtained by interpolating the contents of the table.

Preferably, the voltage measuring unit is a digital oscilloscope.

The S parameter of the measuring system can be an S parameter of the bias tee.

The measuring system can be the measuring system between the field-effect transistor and the voltage measuring unit wherein the measuring system including the bias tee.

In order to achieve the foregoing object, the present disclosure further provides an FET-characteristic measuring method in which a bias voltage output from a bias output terminal of a bias tee is applied to a drain of an FET and a pulse output from a pulse generator is applied to a gate of the FET to generate drain current in the FET; the generated drain current is converted by an impedance of a shunt resistor, connected to an AC output terminal of the bias tee, into a corresponding voltage; and the converted voltage is measured by voltage measuring unit connected to the AC output terminal. The measuring method includes: a step of determining a coefficient indicating a relationship between a measurement voltage of the voltage measuring unit and a voltage drop in the bias voltage due to the drain current, based on at least an S parameter of a measuring system and the impedance of the shunt resistor; a step of determining the voltage drop corresponding to the measurement voltage of the voltage measuring unit, based on the coefficient; and a step of determining a value of a bias voltage actually applied to the drain of the FET, based on the determined voltage drop.

The coefficient can be determined, based on at least the S parameter of the measuring system and the impedance of the shunt resistor and an electrical length of the measuring system.

The S parameter of the measuring system can be an S parameter of the bias tee.

The measuring system can be the measuring system between the field-effect transistor and the voltage measuring unit wherein the measuring system including the bias tee.

In order to achieve the foregoing object, the present disclosure further provides an FET-characteristic measuring method in which a bias voltage output from a bias output terminal of a bias tee is applied to a drain of an FET and a pulse output from a pulse generator is applied to a gate of the FET to generate drain current in the FET; the generated drain current is converted by an impedance of a shunt resistor, connected to AC output terminal of the bias tee, into a corresponding voltage; and the converted voltage is measured by voltage measuring unit connected to the AC output terminal. The measuring method includes: a step of determining a coefficient for converting a measurement voltage of the voltage measuring unit into the drain current, based on at least an S parameter of a measuring system and the impedance of the shunt register; and a step of determining a drain current actually flowing in the FET, based on the measurement voltage of the voltage measuring unit and the coefficient.

The coefficient can be determined, based on at least the S parameter of the measuring system and the impedance of the shunt resistor and an electrical length of the measuring system.

The S parameter of the measuring system can be an S parameter of the bias tee.

The measuring system can be the measuring system between the field-effect transistor and the voltage measuring unit wherein the measuring system including the bias tee.

According to the present disclosure, based on at least the S parameter of a measuring system, the input impedance of the voltage measuring unit or the impedance of the connected shunt register, and the electrical length of the measuring system if necessary, the coefficient indicating the relationship between the measurement voltage of the voltage measuring unit and a voltage drop in the drain bias voltage due to a drain current is determined. Based on a drain voltage drop obtained from the coefficient, a drain bias voltage actually applied to the drain of an FET is determined. Thus, it is possible to obtain high-accuracy measurement results of IV characteristics.

According to the present disclosure, based on at least the S parameter of a measuring system, the input impedance of the voltage measuring unit or the impedance of the connected shunt register, and the electrical length of the measuring system if necessary, the coefficient for converting the measurement voltage of the voltage measuring unit into a drain current is determined, and based on the coefficient, a drain bias voltage actually flowing in the FET is determined. Thus, it is possible to obtain higher-accuracy measurement results of IV characteristics.

DETAILED DESCRIPTION OF THE PREFERRED EMBODIMENT

Figure 1:
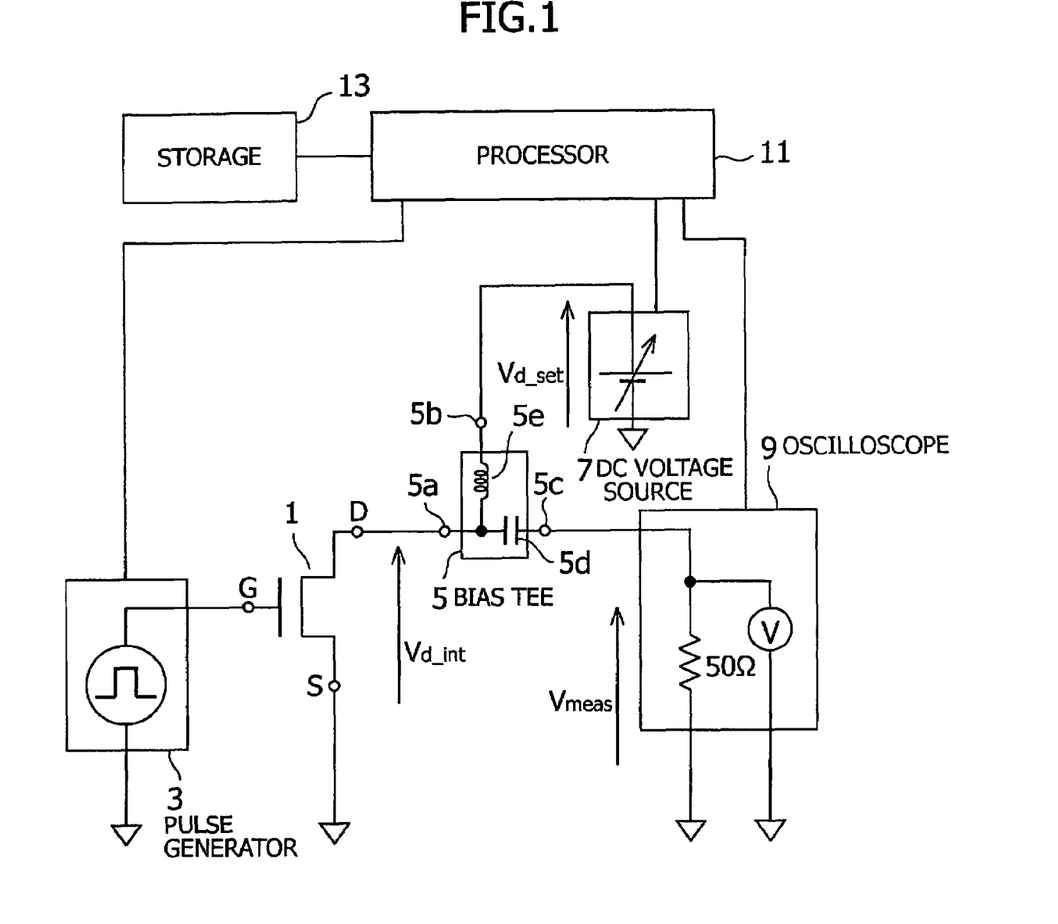
FIG. 1 is a block diagram schematically showing the configuration of a characteristic measuring system for implementing an FET-characteristic measuring method according to one embodiment of the present disclosure.

FIG. 1 is a block diagram schematically showing the configuration of an FET-characteristic measuring system for implementing an FET-characteristic measuring method according to one embodiment of the present disclosure. In this FET-characteristic measuring system, a short-duration (e.g., 100 ns or less) pulse voltage output from a pulse generator 3 is applied to the gate of an FET 1 to measure the IV (current-voltage) characteristics thereof.

The FET 1 shown in FIG. 1 may be a MOSFET, such as an SOI (silicon on insulator) MOSFET, a strained-silicon MOSFET, or a MOSFET using a high-k (high dielectric constant) gate insulator.

The gate of the FET 1 is connected to the pulse generator 3, and the drain of the FET 1 is connected to a DC voltage source 7 and an oscilloscope 9 (which may be a digital oscilloscope) via a so-called bias tee 5. The bias tee 5 has a bias output 5a connected to the drain of the FET 1, a DC input 5b connected to the DC voltage source 7, and an AC output 5c connected to the oscilloscope 9.

The DC voltage source 7 may be implemented with, for example, an SMU (source measure unit) capable of applying a high-accuracy DC voltage and measuring a current. An example is the SMU equipped in Agilent 4156 manufactured by Agilent Technologies, Inc.

When the FET-characteristic measuring system of this embodiment measures the IV characteristics of the FET 1, a predetermined voltage $V_{d\_set}$ is output from the DC voltage source 7 and a predetermined voltage pulse is output from the pulse generator 3. As a result, a pulsed drain current that corresponds to a drain bias voltage $V_{d\_int}$ based on the voltage $V_{d\_set}$ and corresponds to the voltage of the pulse output from the pulse generator 3 and input to the gate flows in the FET 1.

A DC blocking capacitor 5d is interposed between the bias output 5a and the AC output 5c of the bias tee 5 and an inductor 5e is interposed between the bias output 5a and the DC input 5b. Considering the AC behavior, electrical continuity is established between the bias output 5a and the AC output 5c, whereas almost no current flows between the bias output 5a and the DC input 5b because of the high impedance.

Thus, the drain current flows through the DC blocking capacitor 5d and is then converted by the input impedance (which is set to 50 Ω in this example) of the oscilloscope 9 into a voltage pulse, the voltage of which is measured by the oscilloscope as a voltage $V_{meas}$.

Drain voltage measurement as described above is performed based on various drain bias voltages and various gate pulse voltages, so that the IV characteristics of the FET 1 are obtained.

As described above, from a high-frequency point of view, the input impedance of the oscilloscope 9 acts as a shunt resistor interposed between the drain of the FET 1 and the DC voltage source 7. Thus, when the drain current flows, the drain bias voltage of the FET 1 decreases due to a voltage drop caused by the input impedance. The drop in the drain bias voltage can also be caused by impedance due to other factors, such as cables contained in a drain measuring system including the bias tee and a measuring apparatus.

Thus, during the measurement of the drain current, an actual drain bias voltage $V_{d\_int}$ may differ from the output voltage $V_{d\_set}$ of the DC voltage source 7. This means that reliable IV characteristics cannot be obtained when the actual drain bias voltage $V_{d\_int}$ is assumed to be the output voltage $V_{d\_set}$ of the DC voltage source 7.

Accordingly, in this embodiment, a coefficient for determining a voltage drop at the FET drain due the drain current is determined based on the measurement voltage $V_{meas}$ of the oscilloscope 9 and is used to calculate the actual drain bias voltage $V_{d\_int}$, as described below.

Figure 2:
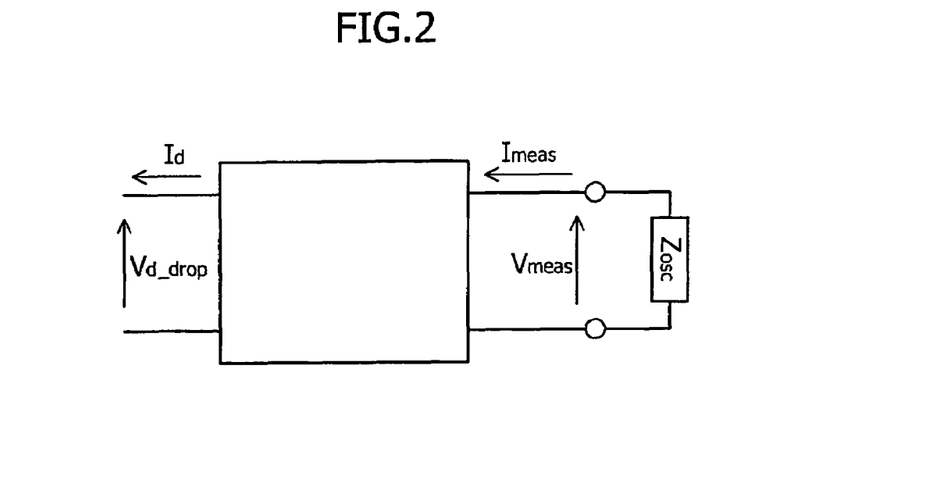
FIG. 2 is a circuit diagram showing a two-terminal-pair network for a drain measuring system.

Now, when a drain measuring system including a cable from the FET 1 to the bias tee 5, the bias tee 5 itself, and a cable from the bias tee 5 to the oscilloscope 9 is regarded as an unknown two-terminal-pair network shown in FIG. 2, the above-mentioned coefficient is defined in terms of the ratio of an input voltage $V_{d\_drop}$ and an output voltage $V_{meas}$ of the two-terminal-pair network.

In FIG. 2, $I_d$ indicates the drain current of the FET 1, $V_{d\_drop}$ indicates a voltage drop at the drain of the FET 1, $V_{meas}$ indicates the measurement voltage of the oscilloscope 9, $I_{meas}$ indicates the input current of the oscilloscope 9, and $Z_{osc}$ indicates the input impedance of the oscilloscope 9.

When Y parameters Yd of the unknown two-terminal-pair network are used, the relationship between the input voltage $V_{d\_drop}$ and the output voltage $V_{meas}$ is given by:

$$\begin{bmatrix} -I_d \\ I_{meas} \end{bmatrix} = \begin{bmatrix} Yd_{11} & Yd_{12} \\ Yd_{21} & Yd_{22} \end{bmatrix} \begin{bmatrix} V_{d\_drop} \\ V_{meas} \end{bmatrix} \quad (1)$$

From this relationship and the relationships $I_{meas} = -V_{meas} \cdot Y_{osc}$ and $Y_{osc} = 1/Z_{osc}$, $V_{d\_drop}$ is expressed by:

$$V_{d\_drop} = -\frac{Y_{osc} + Yd_{22}}{Yd_{21}} V_{meas} \quad (2)$$

Therefore, a transmission coefficient $D_{trans}$ of the two-terminal-pair network is given by equation (3) below and is used as a coefficient for determining $V_{d\_drop}$ from $V_{meas}$.

$$Dtrans = \frac{V_{meas}}{V_{d\_drop}} = -\frac{Yd_{21}}{Y_{osc} + Yd_{22}} \quad (3)$$

The voltage drop $V_{d\_drop}$ is calculated using the transmission coefficient $D_{trans}$ and is subtracted from the output voltage $V_{d\_set}$ of the DC voltage source 7, so that the actual drain bias voltage $V_{d\_int}$ during the drain current measurement can be determined.

Next, an actual calculation procedure for obtaining the transmission coefficient $D_{trans}$ will be specifically described.

The transmission coefficient $D_{trans}$ can be obtained by applying, as $V_{meas}$, a pulse voltage having an amplitude of 1 V to the two-terminal-pair network and measuring the amplitude of the voltage $V_{d\_drop}$ observed during the voltage application.

As is known, a pulse is composed of a variety of frequency components. What are considered during the calculation of the transmission coefficient $D_{trans}$ are frequency components obtained by Fourier-transforming or Fourier-expanding a pulse having specified parameters (a pulse width Wt, rise time (=fall time) $\alpha_t$, cycle $T_t$, and timing of measurement point $t_m$), the pulse being supplied from the pulse generator 3 to the FET 1, and frequency characteristics of the drain measuring system including the oscilloscope 9, the cables, and the bias tee 5.

The timing of measurement point of the parameters specified for the pulse refers to time $t_m$ at which a voltage is actually measured with reference to the midpoint of the rising edge of the pulse, and is used as follows.

That is, when a voltage pulse corresponding to the drain current is input to the oscilloscope 9, the processor 11 reads, as the measurement voltage $V_{meas}$, a voltage at a point when the predetermined time $t_m$ passes from the midpoint of the rising edge of the input voltage pulse.

Consequently, both timings of a measurement point in the width direction of the pulse applied to the gate of the FET 1 and the measurement point of a measurement voltage pulse input to the oscilloscope 9 match each other. Thus, a highly reliable measurement voltage $V_{meas}$ can be obtained by specifying, as the parameter, a timing of measurement point at which the pulse applied to the gate is mostly stable.

For determining the transmission coefficient $D_{trans}$, an S parameter of the drain measuring system and the input impedance $Z_{osc}$ of the oscilloscope 9 and the electrical length $T_{el}$ of the drain measuring system are used. The S parameter and the input impedance $Z_{osc}$ are measured for each frequency by using a network analyzer as an example, and are pre-stored in storage 13 by the processor 11. The electrical length $T_{el}$ is measured with the oscilloscope 9 as an example or obtained by conversion from the above measured S parameter, and the measured electrical length $T_{el}$ is stored into the in storage 13. In this embodiment, the S parameter and the electrical length of the path between the FET 1 and the oscilloscope 9 are measured with the network analyzer as the S parameter and the electrical length of the drain measuring system. And the S parameter of the drain measuring system may includes S parameters of the other components (such as cables, etc., not shown) in the drain measuring system as well as an S parameter of the bias tee 5. When certain component of the drain measuring system such as the bias tee 5 dominate the S parameter and the electrical length of the drain measuring system, the S parameter and the electrical length of the certain component can be used as the S parameter and the electrical length of the drain measuring system. The processor 11 executes the following calculation procedure.

Y parameters $Y_{dn}$ and $Y_{oscn}$ corresponding to each order of a Fourier series for the pulse having the specified parameters are calculated from the S parameters and the input impedance $Z_{osc}$ of the oscilloscope 9.

That is, the S parameters for the respective frequencies are converted using the equation (4) below into Y parameters.

$$Y_{11} = \frac{1}{Z_0} \times \left[\frac{(1-S_{11})(1+S_{22})+S_{12}S_{21}}{(1+S_{11})(1+S_{22})-S_{12}S_{21}}\right] \quad (4)$$

$$Y_{12} = \frac{1}{Z_0} \times \left[\frac{-2S_{12}}{(1+S_{11})(1+S_{22})-S_{12}S_{21}}\right]$$

$$Y_{21} = \frac{1}{Z_0} \times \left[\frac{-2S_{21}}{(1+S_{11})(1+S_{22})-S_{12}S_{21}}\right]$$

$$Y_{22} = \frac{1}{Z_0} \times \left[\frac{(1+S_{11})(1-S_{22})+S_{12}S_{21}}{(1+S_{11})(1+S_{22})-S_{12}S_{21}}\right]$$

where $Z_0$ indicates the characteristic impedance (e.g., 50 $\Omega$) of the network analyzer.

For the conversion of the S-parameter into the Y parameter, when the nth-order frequency $f_n$ of the Fourier series is lower than the minimum frequency used for the actual measurement of the S parameter, the actual measurement value of the S-parameter at the minimum frequency is directly used. When the frequency $f_n$ is higher than the maximum frequency used for the actual measurement of the S parameter, the actual measurement value of the S parameter at the maximum frequency is directly used. Extrapolation in the lower- and higher-limit ranges of the frequencies is not used. This is because actual measurement values in the vicinity of the lower and upper limits vary and thus results determined by such extrapolation may fluctuate.

In actual use of the system shown in FIG. 1, the measurement frequency ranges and the number of measurement points for measurement data of the S parameter in the drain measuring system and the measurement frequency ranges and the number of measurement points for measurement data of the input impedance $Z_{osc}$ of the oscilloscope 9 do not necessarily match each other.

Accordingly, in this embodiment, prior to the determination of the transmission coefficient, the measured input impedance $Z_{osc}$ of the oscilloscope 9 and the S parameter of the drain measuring system are converted into an impedance and a parameter for a frequency corresponding to the Fourier coefficient of each order for a pulse based on a specified condition and then a Y parameter for the frequency of each order is determined.

That is, of frequencies used for measurement of the input impedance $Z_{osc}$ of the oscilloscope 9, a frequency that is lower than and is closest to the nth-order frequency $f_n$ of the Fourier coefficient is indicated by $f_m$ and a frequency that is higher than and is closest to the frequency $f_n$ is indicated by $f_{m+1}$. Further, input impedances measured at the frequencies $f_m$ and $f_{m+1}$ are indicated by $Z_{oscm}$ and $Z_{oscm+1}$, respectively.

The input admittance $Y_{oscn}$ at the nth-order frequency $f_n = n/T_t$ is determined by interpolation, as follows:

$$Yosc_n = Yosc_m + \frac{(Yosc_{m+1} - Yosc_m)}{(f_{m+1} - f_m)}(f_n - f_m) \quad (5)$$

-continued where $$Yosc_m = \frac{1}{Zosc_m}, \text{ and}$$

$$f_n = n\frac{1}{T_t}$$

In this case, an interpolation equation other than equation (5) can also be used.

Next, a Y parameter Yd of the drain measuring system is expressed as:

$$Yd = \begin{bmatrix} Yd11 & Yd12 \\ Yd21 & Yd22 \end{bmatrix} \quad (6)$$

$$Yd_n = \begin{bmatrix} Yd11_n & Yd12_n \\ Yd21_n & Yd22_n \end{bmatrix}$$

Then, nth-order Y parameters shown in equation (7) below are determined.

$$Yd11_n = Yd11_m + \frac{(Yd11_{m+1} - Yd11_m)}{(f_{m+1} - f_m)}(f_n - f_m) \quad (7)$$

$$Yd21_n = Yd21_m + \frac{(Yd21_{m+1} - Yd21_m)}{(f_{m+1} - f_m)}(f_n - f_m)$$

$$Yd12_n = Yd12_m + \frac{(Yd12_{m+1} - Yd12_m)}{(f_{m+1} - f_m)}(f_n - f_m)$$

$$Yd22_n = Yd22_m + \frac{(Yd22_{m+1} - Yd22_m)}{(f_{m+1} - f_m)}(f_n - f_m)$$

The complex Fourier series for the pulse having the specified parameters is expressed by:

$$y_0(t) = A_0 = \frac{w_t}{T_t} \quad (8)$$

$$y_{n(n>0)}(t) = C_n\left\{\text{Cos}\left[n\phi(t) - n\frac{w+\alpha}{2}\right] + i\sin\left[n\phi(t) - n\frac{w+\alpha}{2}\right]\right\}$$

where $$C_n = \frac{w}{\pi}\frac{\sin\frac{n\alpha}{2}}{\frac{n\alpha}{2}}\frac{\sin\frac{nw}{2}}{\frac{nw}{2}},$$

$$w = 2\pi\frac{w_t}{T_t}, \alpha = 2\pi\frac{\alpha_t}{T_t}, \text{ and}$$

$$\phi(t) = 2\pi\frac{t}{T_t}$$

Also, based on equation (3), equation (9) below is given.

$$Dtrans_n = -\frac{Yd_{21n}}{Y_{oscn} + Yd_{22n}} \quad (9)$$

Therefore, based on the Y parameter calculated from equation (5), the Y parameter $Yd_n$ calculated from equation (7), the complex Fourier series expressed by equation (8), and the relationship expressed by equation (9), the transmission coefficient $D_{trans}$ is expressed by:

$$Dtrans = \frac{V_{meas}}{V_{d\_drop}} = \frac{\text{Re}\left\{\sum_{n=0}^{\infty}[y_n(t_m + T_{el}) \times Dtrans_n]\right\}}{\text{Re}\left\{\sum_{n=0}^{\infty} y_n(t_m)\right\}} \quad (10)$$

where $$\infty \approx n\max = \frac{f_{max}}{f_{base}},$$

$$f_{max} = \frac{1}{\alpha_t} \times 5, \text{ and}$$

$$f_{base} = \frac{1}{T_t}$$

In this case, approximation is performed using nmax so as to include sufficiently high frequency components. The transmission coefficient $D_{trans}$ is stored in the storage 13 by the processor 11. Where, Re{ } is a function extracting the real part of the value in the brackets. For example, Re{2+i3}=2. Equation (10) can be simplified with any condition as will be understood by those skilled in the art. For example, equation (10) can be simplified like as equation (11) when the measurement point is at the top part of the pulse and the electrical length $T_{el}$ is negligible.

$$Dtrans = \frac{V_{meas}}{V_{d\_drop}} = \text{Re}\left\{\sum_{n=0}^{\infty}[y_n(t_m) \times Dtrans_n]\right\} \quad (11)$$

Based on the relationship expressed by equation (3) above, the processor 11 determines the drain voltage $V_{d\_drop}$ at the drain of the FET 1 from the determined transmission coefficient $D_{trans}$ and the measurement voltage $V_{meas}$ of the oscilloscope 9. In addition, from the voltage drop $V_{d\_drop}$ and the output voltage $V_{d\_set}$ of the DC voltage source 7, the processor 11 determines the actual drain bias voltage $V_{d\_int}$ during the drain current measurement, i.e., a drain bias voltage $V_{d\_int}$ corresponding to a drain current $I_d$ flowing when the pulse having the specified parameters is applied to the gate of the FET 1. The drain bias voltage $V_{d\_int}$ is given by:

$$V_{d\_int} = V_{d\_set} + V_{d\_drop} = V_{d\_set} + \frac{V_{meas}}{D_{trans}} \quad (12)$$

In this embodiment, a voltage drop $V_{d\_drop}$ that is not affected by either of the frequency components of the pulse output from the pulse generator 3, the pulse having specified parameters, and the frequency characteristics of the drain measuring system are determined. Consequently, the drain bias voltage $V_{d\_int}$ can be estimated with considerable accuracy.

Figure 3:
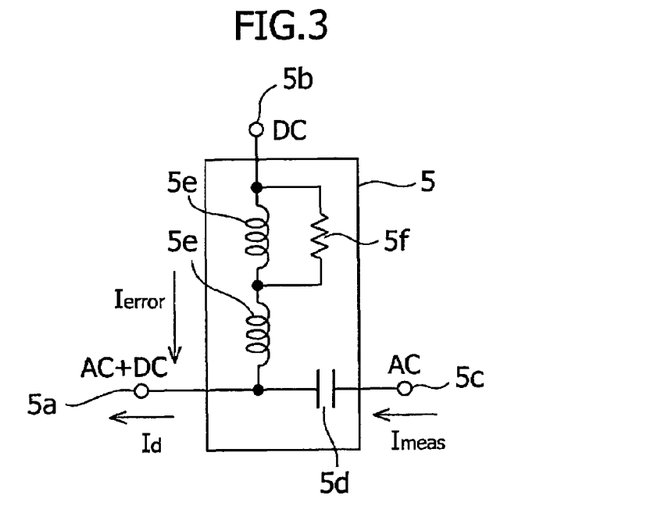
FIG. 3 is a circuit diagram showing one example of the configuration of a bias tee.

In practice, as shown in FIG. 3, a resistor 5f for damping is provided in the bias tee 5. Thus, depending on the size of each inductor 5e, the bias tee 5 impedance (i.e., impedance obtained when a DC input terminal 5b side is viewed from the lower end of the lowermost inductor 5e shown in FIG. 3) with respect to frequency components contained in the pulse does not become large enough relative to the input impedance of the oscilloscope 9. In such a case, since part of the drain current leaks via the bias tee 5, the measurement voltage $V_{meas}$ of the oscilloscope 9 contains an error resulting from the leakage current.

Now, an example for correcting the error will be described.

The two-terminal-pair network of the drain measuring system including the cable from the bias tee 5 to the FET 1, the bias tee 5 itself, and the cable from the bias tee 5 to the oscilloscope 9 is modeled as shown in FIG. 2.

In the two-terminal-pair network, using a Z parameter of the two-terminal-pair network, the relationship between the drain current $I_d$ and the voltage $V_{d\_drop}$ at the drain side of the FET 1 and the current $I_{meas}$ and the voltage $V_{meas}$ at the oscilloscope 9 side can be expressed as:

$$\begin{bmatrix} V_d \\ V_{meas} \end{bmatrix} = \begin{bmatrix} Z_{11} & Z_{12} \\ Z_{21} & Z_{22} \end{bmatrix} \begin{bmatrix} -I_d \\ I_{meas} \end{bmatrix} \quad (13)$$

As described above, $I_d$ indicates the drain current of the FET 1, $V_{d\_drop}$ indicates a voltage drop at the drain of the FET 1, $V_{meas}$ indicates the measurement voltage of the oscilloscope 9, $I_{meas}$ indicates the input current of the oscilloscope 9, and $Z_{osc}$ indicates the input impedance of the oscilloscope 9.

Based on equation (13) above and the relationship $V_{meas} = -I_{meas} \times Z_{osc}$, the drain current $I_d$ is given by:

$$I_d = -V_{meas} \frac{Z_{osc} + Z_{22}}{Z_{osc} Z_{21}} \quad (14)$$

Thus, $(Z_{osc} Z_{21})/(Z_{osc} + Z_{22})$ can be defined as a coefficient $Z_{equiv}$ for converting a measurement voltage of the two-terminal-pair network into a drain current, as shown below:

$$Z_{equiv} = \frac{Z_{osc} Z_{21}}{Z_{osc} + Z_{22}} \quad (15)$$

From equations (14) and (15), the drain current $I_d$ is expressed as:

$$I_d = -\frac{V_{meas}}{Z_{equiv}} \quad (16)$$

The coefficient $Z_{equiv}$ is calculated using equation (16) and is stored in the storage 13. Furthermore, the drain current $I_d$ is determined based on the coefficient $Z_{equiv}$ and the measurement voltage $V_{meas}$ of the oscilloscope 9, the measurement voltage $V_{meas}$ being obtained during the measurement of the IV characteristics.

The coefficient $Z_{equiv}$ is a conversion impedance of the drain measuring system and is used for converting the drain measuring system into a voltage. The drain current $I_d$ calculated from equation (16) is more reliable than a conversion impedance using only the input impedance $Z_{osc}$ of the oscilloscope 9. That is, even when the drain current $I_d$ leaks to the bias tee 5 side, the drain current $I_d$ can be detected accurately.

An actual procedure for calculating the coefficient $Z_{equiv}$ will be described next. This procedure is executed by the processor 11.

As described above, a pulse is composed of a wide variety of frequency components. Thus, what are considered during the calculation of the coefficient $Z_{equiv}$ are frequency components obtained by Fourier-transforming or Fourier-expanding a pulse having specified parameters (a pulse width Wt, rise time (=fall time) $\alpha_r$, cycle $T_t$, and a timing of the measurement point $t_m$) supplied from the pulse generator 3 to the FET 1 and frequency characteristics of the above-noted drain measuring system.

The coefficient $Z_{equiv}$ is determined from a voltage $V_{meas}$ measured when a pulse current having an amplitude of 1 A based on the pulse having the specified parameters is input, as the drain current $I_d$, to the two-terminal-pair network.

Complex Fourier coefficients of a pulse having the specified parameters are used to calculate the coefficient $Z_{equiv}$. For determining the Z parameters, S parameters of the drain measuring system and the input impedance $Z_{osc}$ of the oscilloscope 9 are used.

The S parameters and the input impedance $Z_{osc}$ are measured for individual frequencies by using, for example, a network analyzer (not shown), and are pre-stored in the storage 13 by the processor 11.

Using equation (17) below, the processor 11 converts an S parameter at each measured frequency into a Z parameter:

$$Z_{11} = Z_0 \times \left[ \frac{(1+S_{11})(1-S_{22}) + S_{12}S_{21}}{(1-S_{11})(1-S_{22}) - S_{12}S_{21}} \right] \quad (17)$$

$$Z_{12} = Z_0 \times \left[ \frac{2 S_{12}}{(1-S_{11})(1-S_{22}) - S_{12}S_{21}} \right]$$

$$Z_{21} = Z_0 \times \left[ \frac{2 S_{21}}{(1-S_{11})(1-S_{22}) - S_{12}S_{21}} \right]$$

$$Z_{22} = Z_0 \times \left[ \frac{(1-S_{11})(1+S_{22}) + S_{12}S_{21}}{(1-S_{11})(1-S_{22}) - S_{12}S_{21}} \right]$$

where $Z_0$ indicates the characteristic impedance (e.g., 50 Ω) of the network analyzer.

Once the Z parameter is obtained, the $Z_{equiv}$ for converting the measurement voltage $V_{meas}$ for each frequency into the drain current is determined based on the obtained Z parameter and the input impedance of the oscilloscope 9, as described below.

In actual use of the system shown in FIG. 1, the measurement frequency range and the number of measurement points for the measurement data of the S parameters of the drain measuring system and the measurement frequency range and the number of measurement points for measurement data of the input impedance $Z_{osc}$ of the oscilloscope 9 do not necessarily match each other.

Accordingly, in this embodiment, prior to the calculation of the coefficient $Z_{equiv}$, the actually measured input impedance $Z_{osc}$ of the oscilloscope 9 and the S parameter of the drain measuring system are first converted into an impedance and a parameter for a frequency corresponding to the Fourier coefficient of each order for a pulse having specified parameters (conditions) and then the coefficient $Z_{equiv}$ for the frequency of each order is determined.

The Fourier series for the pulse having the specified parameters can be expressed as:

$$y_0(t) = A_0 = \frac{w_t}{T_t} \quad (18)$$

$$y_{n(>0)}(t) = C_n \left\{ \cos\left[n\phi(t) - n\frac{w+\alpha}{2}\right] + i\sin\left[n\phi(t) - n\frac{w+\alpha}{2}\right] \right\}$$

where $$C_n = \frac{w}{\pi} \frac{\sin\frac{n\alpha}{2}}{\frac{n\alpha}{2}} \frac{\sin\frac{nw}{2}}{\frac{nw}{2}},$$

-continued
$$w = 2\pi \frac{w_t}{T_t}, \alpha = 2\pi \frac{\alpha_t}{T_t}, \text{ and}$$

$$\phi(t) = 2\pi \frac{t}{T_t}$$

For the conversion of the S-parameter into the Z parameter, when the nth-order frequency $f_n$ of the Fourier series is lower than the minimum frequency used for the actual measurement of the S parameter, the actual measurement value of the S-parameter at the minimum frequency is directly used. When the frequency $f_n$ is higher than the maximum frequency used for the actual measurement of the S parameter, the actual measurement value of the S parameter at the maximum frequency is directly used. Extrapolation in the lower- and higher-limit ranges of the frequencies is not used. This is because actual measurement values in the vicinity of the lower and upper limits vary and thus results determined by such extrapolation may fluctuate.

Now, of the frequencies used for measurement of the input impedance $Z_{osc}$ of the oscilloscope 9, a frequency that is lower than and is closest to the nth-order frequency $f_n$ of the Fourier coefficient is indicated by $f_m$, and a frequency that is higher than and is closest to the frequency $f_n$ is indicated by $f_{m+1}$. Further, input impedances measured at the frequencies $f_m$ and $f_{m+1}$ are indicated by $Z_{oscm}$ and $Z_{oscm+1}$, respectively. In this case, the input admittance $Y_{oscn}$ at the nth-order frequency $f_n = n/T_t$ is determined by interpolation, as follows:

$$Zosc_n = Zosc_m + \frac{(Zosc_{m+1} - Zosc_m)}{(f_{m+1} - f_m)}(f_n - f_m) \quad (19)$$

where $$f_n = n\frac{1}{T_t}$$

In this case, an interpolation equation other than equation (19) can also be used.

Next, a Z parameter Zd of the drain measuring system is expressed as:

$$Zd = \begin{bmatrix} Zd11 & Zd12 \\ Zd21 & Zd22 \end{bmatrix} \quad (20)$$

$$Zd_n = \begin{bmatrix} Zd11_n & Zd12_n \\ Zd21_n & Zd22_n \end{bmatrix}$$

and the nth-order Z parameters shown below are determined.

$$Zd11_n = Zd11_m + \frac{(Zd11_{m+1} - Zd11_m)}{(f_{m+1} - f_m)}(f_n - f_m) \quad (21)$$

$$Zd21_n = Zd21_m + \frac{(Zd21_{m+1} - Zd21_m)}{(f_{m+1} - f_m)}(f_n - f_m)$$

$$Zd12_n = Zd12_m + \frac{(Zd12_{m+1} - Zd12_m)}{(f_{m+1} - f_m)}(f_n - f_m)$$

$$Zd22_n = Zd22_m + \frac{(Zd22_{m+1} - Zd22_m)}{(f_{m+1} - f_m)}(f_n - f_m)$$

The coefficient $Z_{equiv}$ is obtained based on an amplitude of the voltage $V_{meas}$ measured with oscilloscope 9 when a pulse current having 1 A amplitude flows through the drain of the FET 1. Specifically, the coefficient $Z_{equiv}$ is calculated with equation (18), (19), (21) and (22). In this case, approximation is performed using nmax so as to include sufficiently high frequency components. The transmission coefficient $Z_{equiv}$ is stored in the storage 13 by the processor 11.

$$Z_{equiv} = -\frac{V_{normal}}{I_d} = \frac{\text{Re}\left\{\sum_{n=0}^{\infty}[y_n(t_m + T_{el}) \times Zequiv_n]\right\}}{\text{Re}\left\{\sum_{n=0}^{\infty}[y_n(t_m)]\right\}} \quad (22)$$

where $$\infty \approx n\max = \frac{f_{max}}{f_{base}},$$

$$f_{max} = \frac{1}{\alpha_t} \times 5,$$

$$f_{base} = \frac{1}{T_t}, \text{ and}$$

$$Zequiv_n = \frac{Zosc_n Zd21_n}{Zosc_n + Zd22_n}$$

Equation (22) can be simplified with any condition as will be understood by those skilled in the art. For example, equation (22) can be simplified like as equation (23) when the measurement point is at the top part of the pulse and the electrical length $T_{el}$ is negligible.

$$Z_{equiv} = -\frac{V_{normal}}{I_d} = \text{Re}\left\{\sum_{n=0}^{\infty}[y_n(t_m) \times Zequiv_n]\right\} \quad (23)$$

Thus, the processor 11 determines the drain current $I_d$, based on the transmission coefficient $Z_{equiv}$, the actual measurement voltage $V_{meas}$ of the oscilloscope 9, and equation (16). In this case, approximation is performed using nmax so as to include sufficiently high frequency components.

In this embodiment, since the drain current $I_d$ is determined based on the coefficient $Z_{equiv}$ that corresponds to the frequency components of the pulse having the specified parameters and corresponds to the frequency characteristics of the drain measuring system, the drain current $I_d$ can be detected accurately.

While an embodiment of the present disclosure has been described above, various changes and modifications can be made thereto.

For example, the transmission coefficient $D_{trans}$ calculated from equation (10) or (11) can be determined in advance not only for one pulse having specified parameters (e.g., a pulse width) but also for multiple pulses having specified parameters that are different from each other, i.e., multiple pulses having frequency components that are different from each other. In this case, the transmission coefficients $D_{trans}$ for the multiple pulses are stored, in a table in the storage 13, together with parameters of corresponding pulses. With this arrangement, since the transmission coefficients $D_{trans}$ for the multiple pulses having parameters that are different from each other can be promptly obtained from the table, the time for measuring the IV characteristics can be reduced.

When a specified parameter is different from parameters stored in the table, a transmission coefficient $D_{trans}$ corresponding to the specified parameter can be interpolated using the transmission coefficients $D_{trans}$ stored in the table.

Similarly to the transmission coefficients $D_{trans}$, coefficients $Z_{equiv}$ calculated from equation (22) or (23) can be determined in advance, respectively, for multiple pulses having specified parameters that are different from each other and be stored, in a table in the storage 13, together with the parameters of corresponding pulses. When a specified parameter is different from parameters stored in the table, a coefficient $Z_{equiv}$ corresponding to the specified parameter can be interpolated using the coefficients $Z_{equiv}$ stored in the table.

In this embodiment, the storage 13 is connected to the processor 11. The present disclosure, however, also includes a configuration in which storage provided in the processor 11 is used instead of the storage 13.

Figure 4:
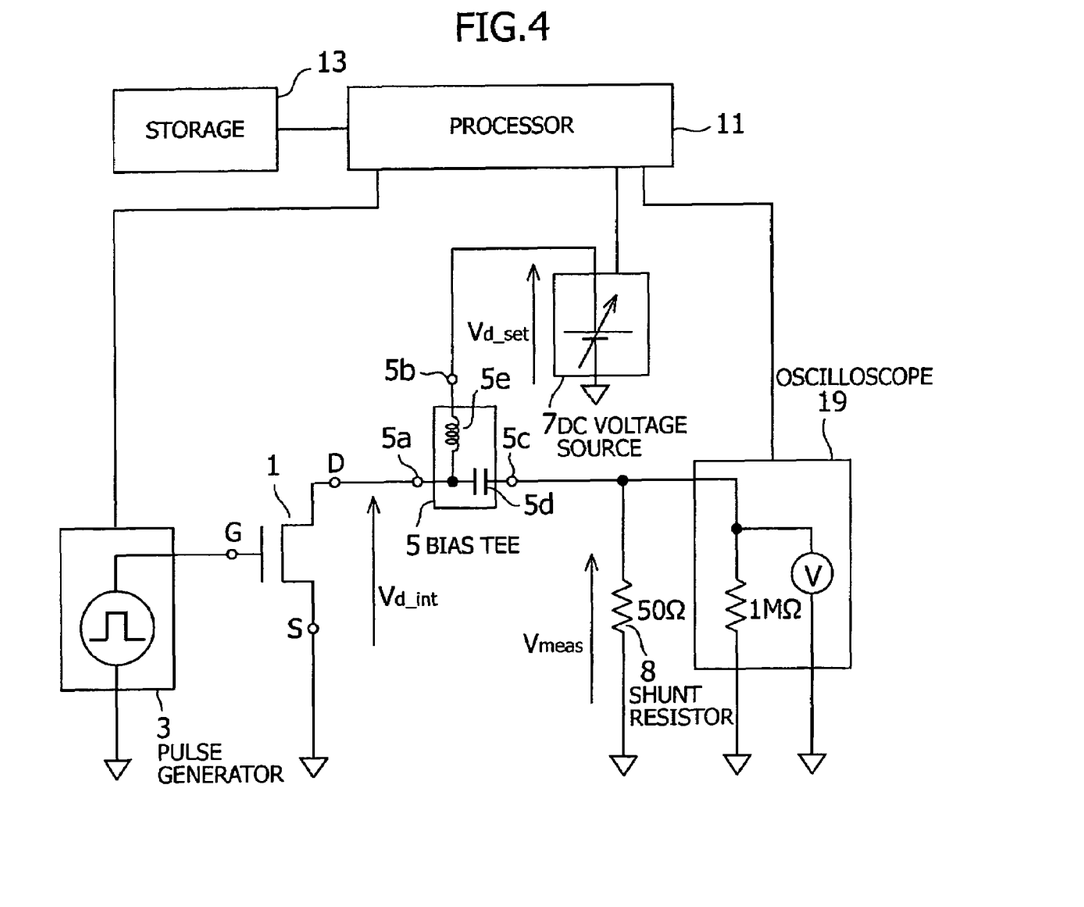
FIG. 4 is a block diagram schematically showing the configuration of a characteristic measuring system for implementing an FET-characteristic measuring method according to another embodiment of the present disclosure.

The FET-characteristic measuring method according to the present disclosure can also be implemented by a measuring system shown in FIG. 4. In FIG. 4, elements similar to those shown in FIG. 1 are denoted by the same reference characters.

The system shown in FIG. 4 differs from the system shown in FIG. 1 in that a shunt resistor 8 (50 Ω in this example) different from the input impedance of an oscilloscope 19 is connected to a terminal 5c of the bias tee 5, and the input impedance of the oscilloscope 19 is set to be high (e.g., 1 MΩ).

When the system shown in FIG. 4 is used to measure a drain current and a bias voltage applied to the drain of an FET, the impedance of the shunt resistor 8 acts in the same manner as the input impedance $Z_{osc}$ of the oscilloscope 9 shown in FIG. 1. Thus, redundant descriptions regarding a measuring procedure using the system shown in FIG. 4 are omitted hereinafter.

According to the embodiment using the system shown in FIG. 4, the function of the input impedance $Z_{osc}$ of the oscilloscope 9 in the system shown in FIG. 1 is accomplished by the shunt resistor 8. Thus, the use of a high-accuracy resistor as the shunt resistor 8 can provide accurate measurement results of the IV characteristics. As described above, since the oscilloscope 19 has a high input impedance, the input impedance does not affect the measurement results.

What is claimed is:

1. A field-effect-transistor characteristic measuring method in which a bias voltage output from a bias output terminal of a measuring system is applied to a drain of a field-effect transistor and a pulse output from a pulse generator is applied to a gate of the field-effect transistor; the generated drain current is converted by an input impedance of voltage measuring unit, connected to an alternating-current output terminal of the measuring system, into a corresponding voltage; and the converted voltage is measured by the voltage measuring unit, the measuring method comprising:

a step of determining a coefficient indicating a relationship between a measurement voltage of the voltage measuring unit and a voltage drop in the bias voltage due to the drain current, based on at least:

an S parameter of the measuring system connected between the field-effect-transistor and the voltage measuring unit, wherein the measuring system comprises:
a bias tee; and
at least one other component; and
the input impedance of the voltage measuring unit;

a step of determining the voltage drop corresponding to the measurement voltage of the voltage measuring unit, based on the coefficient; and a step of determining a value of bias voltage actually applied to the drain of the field-effect transistor, based on the determined voltage drop.

2. The measuring method according to claim 1, wherein the coefficient determining step comprises:

a step of determining Y parameters corresponding to each order of a Fourier series for the pulse output from the pulse generator, based on the S parameters for multiple frequencies and the input impedance of the voltage measuring unit; and a step of determining the coefficient, based on the Y parameters and the Fourier series.

3. The measuring method according to claim 1, wherein:
the measuring method additionally comprises a step of measuring an electrical length of the measuring system; and
the step of determining the coefficient is additionally based on the electrical length of the measuring system.

4. The measuring method according to claim 3, wherein the coefficient determining step comprises:

a step of determining Y parameters corresponding to each order of a Fourier series for the pulse output from the pulse generator, based on the S parameters for multiple frequencies and the input impedance of the voltage measuring unit; and a step of determining the coefficient, based on the Y parameters and the Fourier series and the electrical length.

5. The measuring method according to claim 1, wherein the coefficient is determined for each of multiple pulses having different pulse widths from each other, the multiple pulses being output from the pulse generator, and relationships between the pulse widths of the multiple pulses and the coefficients corresponding to the pulse widths are stored in a table in storage.

6. The measuring method according to claim 5, wherein, when a pulse having a pulse width different from the pulse widths of the multiple pulses is output from the pulse generator, the coefficient corresponding to the pulse output from the pulse generator is obtained by interpolating the contents of the table.

7. The measuring method according to claim 1, wherein the voltage measuring unit comprises a digital oscilloscope.

* * * * *